(12) United States Patent
Huang

(10) Patent No.: US 6,767,844 B2
(45) Date of Patent: Jul. 27, 2004

(54) PLASMA CHAMBER EQUIPPED WITH TEMPERATURE-CONTROLLED FOCUS RING AND METHOD OF OPERATING

(75) Inventor: Chuan-Chieh Huang, Hsin-Chu (TW)

(73) Assignee: Taiwan SEmiconductor Manufacturing Co., Ltd, Hsin-Chu (TW)

(*) Notice: Subject to any disclaimer, the term of this patent is extended or adjusted under 35 U.S.C. 154(b) by 0 days.

(21) Appl. No.: 10/190,412

(22) Filed: Jul. 3, 2002

(65) Prior Publication Data

US 2004/0005726 A1 Jan. 8, 2004

(51) Int. Cl.$^7$ .............................................. H01L 21/31
(52) U.S. Cl. ...................... 438/758; 438/636; 438/582; 438/738
(58) Field of Search ................................ 438/758, 738, 438/636, 582; 156/345

(56) References Cited

U.S. PATENT DOCUMENTS

| | | | | |
|---|---|---|---|---|
| 5,001,327 A | * | 3/1991 | Hirasawa et al. | 219/390 |
| 5,474,649 A | * | 12/1995 | Kava et al. | 438/729 |
| 6,120,640 A | * | 9/2000 | Shih et al. | 156/345.1 |
| 6,533,910 B2 | * | 3/2003 | O'Donnell et al. | 204/298.31 |
| 6,541,164 B1 | * | 4/2003 | Kumar et al. | 430/5 |
| 2003/0198749 A1 | * | 10/2003 | Kumar et al. | 427/376.3 |

* cited by examiner

Primary Examiner—John F. Niebling
Assistant Examiner—Olivia T. Luk
(74) Attorney, Agent, or Firm—Tung & Associates

(57) ABSTRACT

A temperature-controlled focus ring assembly for use in a plasma chamber that includes a focus ring surrounding a wafer pedestal for confining plasma ions to a top surface of a wafer positioned on the wafer pedestal; a heat transfer means in intimate contact with the focus ring for decreasing or increasing the temperature of the focus ring; and a controller for controlling the temperature of the focus ring to a predetermined value. The invention further discloses a method for operating a plasma chamber equipped with a temperature-controlled focus ring assembly.

17 Claims, 3 Drawing Sheets

PLASMA CHAMBER EQUIPPED WITH TEMPERATURE-CONTROLLED FOCUS RING AND METHOD OF OPERATING

FIELD OF THE INVENTION

The present invention generally relates to a semiconductor processing equipment and a method for using the equipment, more particularly, relates to a plasma chamber that is equipped with a temperature-controlled focus ring and a method of operating the chamber.

BACKGROUND OF THE INVENTION

In the fabrication of modern integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 µm or less for high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is thus used for such via formation process.

The via hole formation process can be enhanced by improving the etch directionality by a mechanism known as sidewall passivation to improve the anisotropy of the etching process. By utilizing a suitable etchant gas and suitable reactor parameters, an etch-inhibiting film of a polymeric nature can be formed on vertical sidewalls. The etch-inhibiting film slows down or completely stops any possible lateral etching of horizontal surfaces in the via hole. For instance, when a fluorine-containing etchant gas such as $CFH_3$ is used, a fluorine-type polymeric film is formed on the sidewalls. Many photoresist materials may also contribute to the formation of polymeric films on the sidewalls. After the sidewall is coated with a polymeric film, it is protected by the inhibitor film to preserve the line width or via hole diameter control.

In a modern etch chamber, an electrostatic chuck (or E-chuck), is frequently used in which the chuck electrostatically attracts and holds a wafer that is positioned on top. The use of E-chuck is highly desirable in the vacuum handling and processing of wafers. In contrast to a conventional method of holding wafers by mechanical clamping means where only slow movement is allowed during wafer handling, an E-chuck can hold and move wafers with a force equivalent to several tens of Torr pressure. Another advantage for the E-chuck is that no particle generation or contamination problem can occur since there are no moving parts acting on the wafer. Moreover, the electrostatic force utilized on an E-chuck is sufficient in preventing bowing of a wafer which normally occurs in mechanical clamping and thus promotes uniform heat transfer over the entire wafer surface.

In an etch chamber equipped with a plasma generating device and an E-chuck, a shadow ring may be utilized as a seal around the peripheral edge of the wafer. The shadow ring, also known as a focus ring, is utilized for achieving a more uniform plasma distribution over the entire surface of the wafer and for restricting the distribution of the plasma cloud to only the wafer surface area, i.e. and thus the name of focus ring. The uniform distribution function may be further enhanced by a RF bias voltage applied on the wafer during a plasma etching process. Another function served by the shadow ring is sealing at the wafer level the upper compartment of the etch chamber which contains the plasma from the lower compartment of the etch chamber which contains various mechanical components for controlling the E-chuck. This is important since it prevents the plasma from attacking the hardware components contained in the lower compartment of the etch chamber. In order to survive high temperature and hostile environments, a shadow ring is frequently constructed of a ceramic material such as quartz.

In an etch chamber equipped with a high density plasma and an E-chuck, problems sometimes arise in the operation of the E-chuck. High density gas plasma formed has a short debye length and consequently vary small sheaths are formed at boundaries of objects that are present in the gas plasma. In order to prevent the plasma from affecting the voltage on the electrode of the E-chuck, the electrode positioned in a plasma chamber must be sufficiently isolated from the plasma. In a typical E-chuck positioned in a high density plasma, the electrode has a voltage applied to it with respect to a ground reference point. The wafer is referenced back to the same ground reference by the plasma. The effective voltage for the electrostatic clamping of the wafer is then the voltage which appears across the E-chuck dielectric layer between the isolated electrode and the wafer. The voltage applied to the isolated electrode may be positive or negative with respect to the chamber ground. However, the electrostatic force depends on the algebraic difference between the wafer and the isolated electrode.

When the gaps around an E-chuck exceed several debye lengths, plasma may either be generated in the gaps or may be extracted into the gaps. When the plasma contacts the electrostatic chuck which has an imperfect dielectric layer or the E-chuck electrode, a current may flow between the E-chuck and the plasma. The voltage at the E-chuck electrode is therefore affected. Typically, the magnitude of the E-chuck voltage is reduced when a current flows between the chuck and the plasma which leads to a reduction in the electrostatic force. The efficiency of the E-chuck for holding a wafer is therefore affected. Ideally, the solution to the problem is to shield the E-chuck from the high density plasma by limiting gaps between the E-chuck and a shadow ring around the E-chuck to less than several debye lengths. In such an ideal situation, plasma can be prevented from being generated in the gaps or being extracted into the gaps. Since the ideal equipment conditions cannot be achieved in a manufacturing environment, the generation of plasma in the gaps or the extraction of plasma into the gaps and therefore attacking a shadow ring which is normally fabricated of quartz cannot be avoided. In a normal fabrication environment, it has been found that a quartz shadow ring would only survive about one preventive maintenance cycle or about 2,000 wafers. The corrosion occurred on the surface of the quartz shadow ring is usually severe enough that it must be replaced during a preventive maintenance procedure.

Referring initially to FIG. 1, wherein a conventional etch chamber 10 equipped with a shadow ring 12 around an electrostatic chuck 16 is shown. The etch chamber 10 is equipped with a coil antenna 14 as a plasma source in a reaction chamber 20 formed by a silicon ceiling block 22, a dome-shaped sidewall 24, a chamber wall liner 26 and the electrostatic chuck 16. The dome-shaped sidewall 24 and the chamber wall liner 26 are normally fabricated of quartz. The chamber wall liner 26 may be equipped with an opening for the passage of a wafer paddle in loading and unloading wafers. It may be removed from the vacuum chamber 10 for cleaning.

The shadow ring 12 is positioned inside the plasma reaction chamber 20 which can be lifted up to a process position by positioning pins 32. The positioning pins 32 lift the shadow ring 12 away from the wafer when a wafer is being loaded or unloaded. A multiplicity of cooling gas channels 34 is provided inside the electrostatic chuck 16 at near its top surface 36. A high heat conductivity gas such as helium can be circulated through the cooling gas channels 34 to provide a suitable gas pressure on the bottom side of wafer 30 for transferring heat away from the wafer to the water-cooled E-chuck 16 during an etch process. The supply lines for the cooling gas to channel 34 are not shown. The electrostatic chuck 16 is aligned by an electrostatic chuck collar 38. The etching gas is fed into chamber 20 through gas inlet 28. A thermal coupler 42 is mounted in the silicon ceiling block 22 for controlling temperature.

The shadow ring, or focus ring 12, is frequently formed of a ceramic material such as quartz for its high temperature stability. However, when quartz is bombarded by plasma ions, oxygen atoms may evolve from the quartz and become a serious contaminating species in the plasma chamber. To avoid contamination by oxygen atoms, silicon is frequently used as the material for fabricating the focus ring 12. This is shown in FIGS. 2 and 2A.

In plasma chambers that are used for plasma etching processes, the etchant gas of a fluorine-containing plasma cause a physical interaction, i.e. an adsorption process of the fluorine ions or radicals onto the surface of silicon. This is shown in FIG. 2. The plasma ions or radicals at close to the edges of the wafer 30 are diverted and attracted to the silicon focus ring 12 for attaching themselves to the top surface of the silicon focus ring. As a result, shown in FIG. 2A, the plasma density at the edges of the wafer 30 is decreased, resulting in a decrease in the etch rates along the edges of a wafer.

The decreases in the etch rates of silicon oxide, i.e. where the bias voltage is the smallest, is shown in FIG. 4A at various levels of source voltages. It is seen that a significant drop in the oxide etch rates has occurred along the edges of the wafer. It is to be noted that the bias voltage is the voltage applied to the E-chuck 16 shown in FIG. 2.

Similarly, the deterioration in the oxide etch rate is plotted against the source voltage at five different levels of bias voltages in FIG. 4B. The largest source voltage occurs along the edges of the plasma zone, indicative of the edges of the wafer 30 shown in FIG. 2.

It is therefore an object of the present invention to provide a focus ring assembly for use in a plasma chamber that does not have the drawbacks or shortcomings of the conventional focus rings.

It is another object of the present invention to provide a focus ring assembly wherein the focus ring is fabricated of silicon for use in a fluorine-containing plasma.

It is a further object of the present invention to provide a focus ring assembly for use in a plasma chamber that is constructed of a focus ring and a heat transfer means.

It is another further object of the present invention to provide a focus ring assembly for use in a plasma chamber that does not effect the plasma density along the edges of the wafer during etching.

It is still another object of the present invention to provide a focus ring assembly for use in a plasma chamber which does not decrease the etch rates of oxide along the edges of a wafer.

It is yet another object of the present invention to provide a plasma chamber that is equipped with a temperature-controlled focus ring.

It is still another further object of the present invention to provide a plasma chamber that is equipped with a focus ring which is controlled in temperature by a heat transfer means.

SUMMARY OF THE INVENTION

In accordance with the present invention, a focus ring assembly for use in a plasma chamber that is temperature-controlled and a method for operating the chamber are provided.

In a preferred embodiment, a focus ring assembly for use in a plasma chamber is provided which includes a focus ring surrounding a wafer pedestal for confining plasma ions to a top surface of a wafer positioned on the wafer pedestal; a heat transfer means in intimate contact with the focus ring for decreasing or increasing a temperature of the focus ring; and a controller for controlling the temperature of the focus ring to a preset value.

In the focus ring assembly for use in a plasma chamber, the focus ring is fabricated of a material that adsorbs plasma ions on a top surface of the focus ring. The focus ring may be fabricated of silicon and the process chamber may generate a fluorine-containing plasma. The heat transfer means is in intimate contact with a bottom surface of the focus ring. The heat transfer means may be a cooling means, or a heating means. The heat transfer means may be formed in a ring shape that has a planar top surface area substantially the same as a bottom planar surface area of the focus ring. The focus ring surrounds an electrostatic wafer chucking device, and may be fabricated of silicon that is sufficiently cooled such that substantially no fluorine ions or radicals are adsorbed on a top surface of the focus ring. The focus ring may be controlled to a temperature within a range of 100° C.±30° C.

The present invention is further directed to a plasma chamber that is equipped with a temperature-controlled focus ring including a chamber enclosure defining a cavity therein capable of maintaining a pressure not higher than 1 Torr; a plasma generating means for producing a plasma in the cavity; a wafer pedestal for holding a wafer thereon; a focus ring surrounding the wafer pedestal for confining plasma ions to a top surface of the wafer held on the wafer pedestal; and a heat transfer means in intimate contact with the focus ring for controlling a temperature of the focus ring.

In the plasma chamber equipped with a temperature-controlled focus ring, the wafer pedestal may be an electrostatic wafer chucking device. The plasma chamber may further include a controller for controlling a temperature of the focus ring to a predetermined value. The plasma produced in the chamber cavity may be a fluorine-containing plasma for etching oxide layers on a wafer. The focus ring may be fabricated of a material that adsorbs plasma ions or radicals on a top surface of the focus ring. The focus ring may be fabricated of silicon. The heat transfer means controls a temperature of the focus ring to within a range of 100° C.±30° C.

The present invention is still further directed to a method for operating a plasma chamber that is equipped with a temperature-controlled focus ring including the operating steps of first providing a plasma chamber that has a chamber enclosure defining a cavity therein; a plasma generating means; a wafer pedestal; a focus ring surrounding the wafer pedestal; and a heat transfer means in intimate contact with the focus ring; mounting a wafer to be processed on top of the wafer pedestal; controlling a temperature of the focus ring by the heat transfer means to a predetermined temperature; and igniting a plasma in the cavity and substantially confining the plasma to a top surface of the wafer by the temperature-controlled focus ring.

The method for operating a plasma chamber that is equipped with a temperature-controlled focus ring may further include the steps of providing a focus ring fabricated of silicon; and igniting a plasma including fluorine ions in the cavity. The method may further include the step of controlling a temperature of the focus ring by the heat transfer means to within a range of 100° C.±30° C.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a focus ring assembly for use in a plasma chamber, and a plasma chamber equipped with a temperature-controlled focus ring. The present invention further discloses a method for operating a plasma chamber that is equipped with a temperature-controlled focus ring.

The focus ring assembly of the present invention for use in a plasma chamber includes a focus ring, a heat transfer means and a controller. The focus ring is used to surround a wafer pedestal for confining plasma ions to a top surface of a wafer positioned on the pedestal. A heat transfer means is mounted in intimate contact with the focus ring for decreasing or increasing a temperature of the focus ring. A controller for controlling the temperature of the focus ring to a predetermined value.

While the present invention focus ring assembly can be used in any plasma chambers, i.e. plasma etch chamber or plasma deposition chamber, it is particularly suitable for use in a plasma etch chamber wherein fluorine-containing plasma is utilized.

The present invention focus ring assembly is also suitable for use in a plasma etch chamber wherein a silicon focus ring surrounds an electro-static wafer chucking device.

The present invention further discloses a plasma chamber that is equipped with a temperature-controlled focus ring which includes a chamber enclosure that defines a cavity, a plasma generating means, a wafer pedestal of the electro-static chucking type, a focus ring surrounding the pedestal, and a heat transfer means for controlling the temperature of the focus ring.

Figure 1:
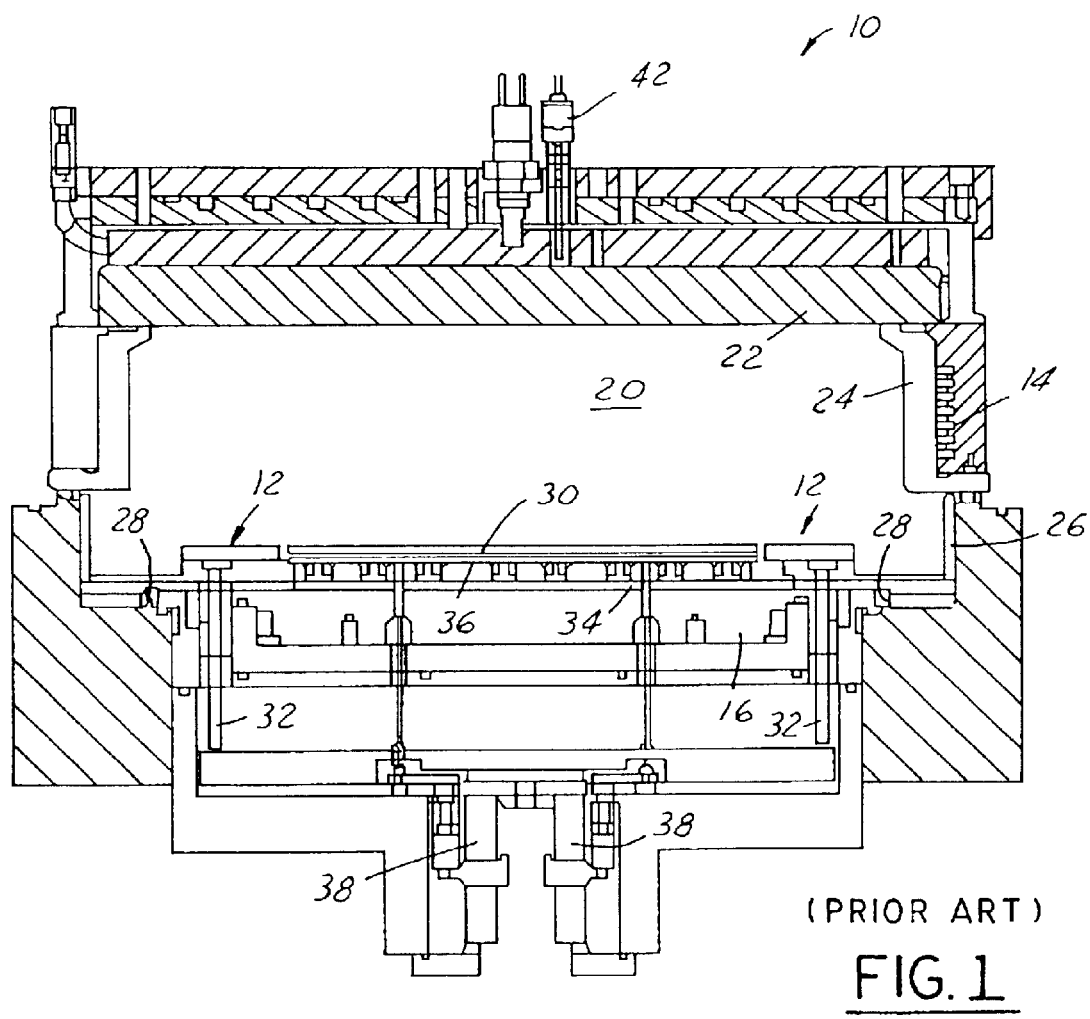
FIG. 1 is a cross-sectional view of a conventional plasma etch chamber equipped with an electro-static chuck and a focus ring.
Figure 2:
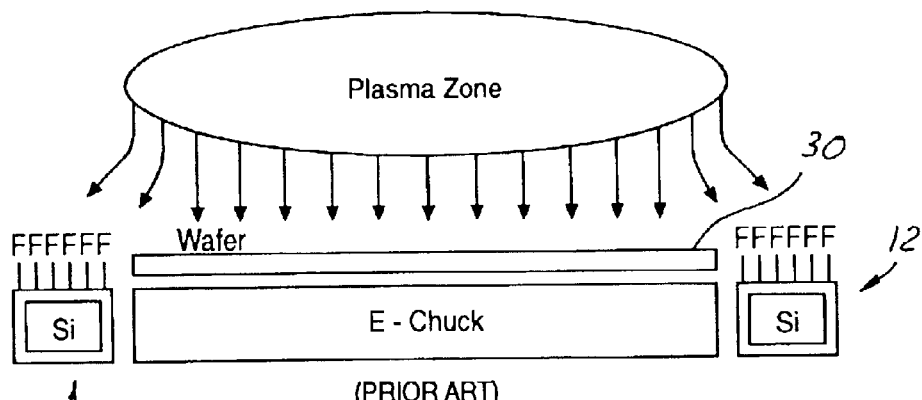
FIG. 2 is an illustration of a cross-sectional view of a plasma etch chamber equipped with a silicon focus ring and bombarded with fluorine-containing plasma ions.
Figure 2A:
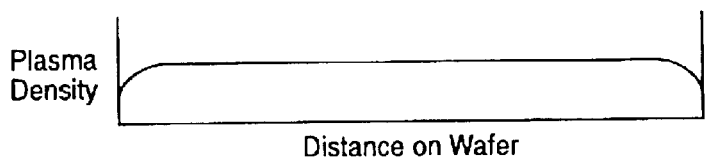
FIG. 2A is a graph illustrating the dependency of the plasma density on the location on the wafer for the set-up of FIG. 2.
Figure 3:
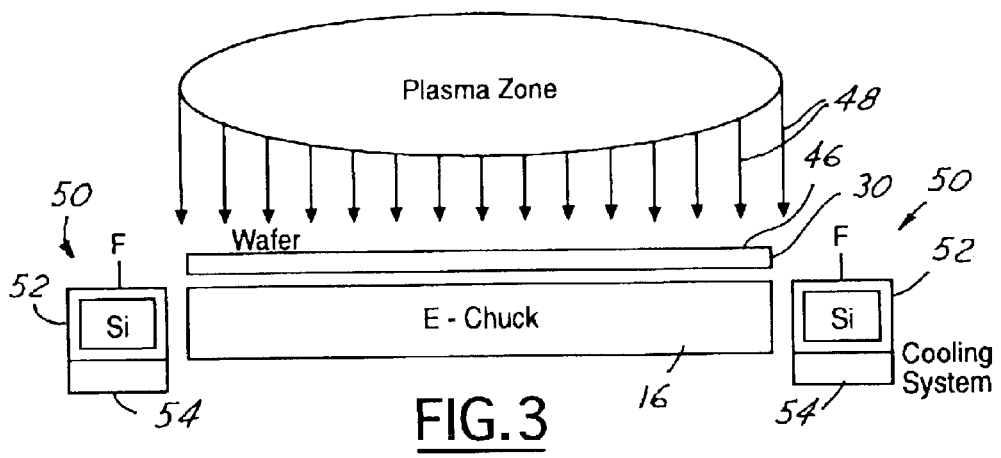
FIG. 3 is an illustration of a cross-sectional view of a present invention focus ring assembly equipped with a heat transfer means.

Referring now to FIG. 3, wherein a present invention focus ring assembly 50 is shown. The focus ring assembly 50 is constructed of a focus ring 52 that surrounds an electro-static chuck 16 for confining plasma ions 48 to a top surface 46 of the wafer 30 that is positioned on the E-chuck 16. A heat transfer means 54 which may either be a cooling means or a heating means is mounted in intimate contact with the focus ring for decreasing or increasing the temperature of the focus ring. A temperature controller (not shown) is also used for controlling the temperature of the focus ring to a preset value.

Figure 3A:
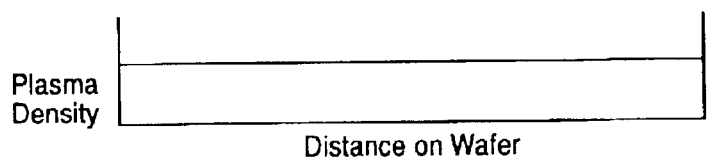
FIG. 3A is a graph illustrating the dependency of the plasma density on the location on the wafer for the present invention silicon focus ring of FIG. 3.
Figure 4A:
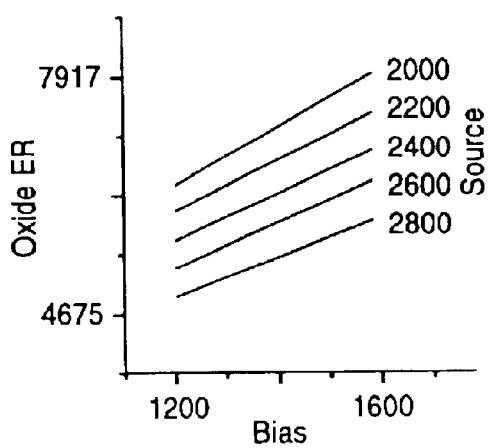
FIGS. 4A and 4B are graphs illustrating the dependency of the oxide etch rate on the bias voltage and source voltage, respectively.

As shown in FIG. 3A, when the present invention focus ring assembly 50 is utilized, the fluorine ions (or radicals) 48 are not attracted to the silicon focus ring and, as a result, the plasma density at the edge portion of the wafer 30 is not decreased.

Figure 5A:
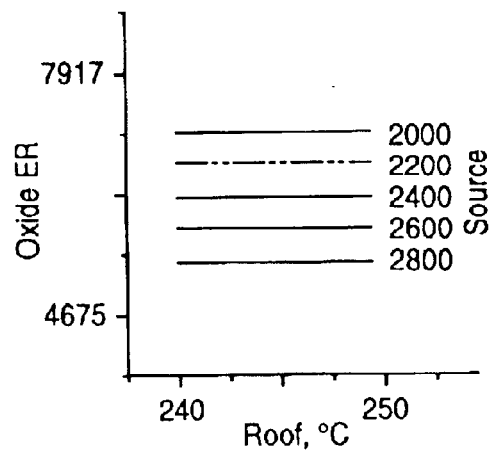
FIGS. 5A and 5B are graphs illustrating the dependency of the oxide etch rate on the roof temperature at different levels of source voltage and bias voltage, respectively, in a plasma etch chamber equipped with the present invention focus ring.
Figure 4B:
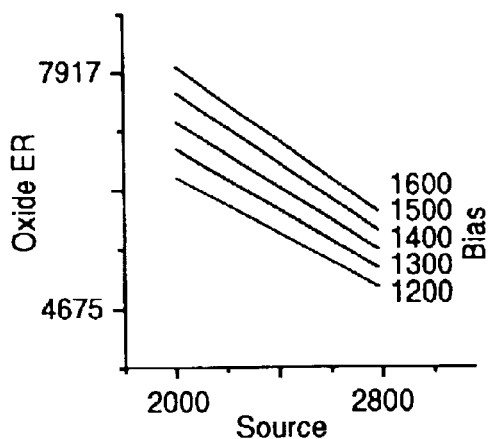
Figure 5B:
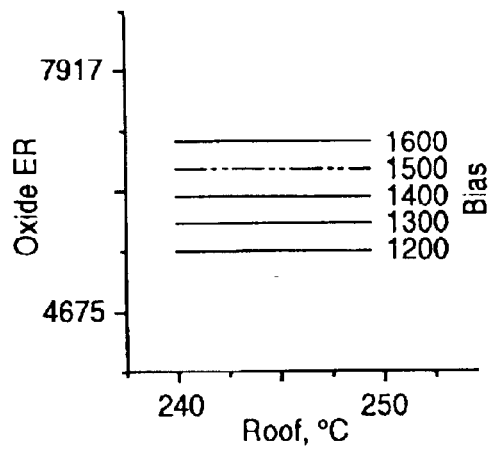

The effectiveness of the present invention focus ring assembly 50 is further shown in FIGS. 5A and 5B. In the range of a roof temperature between about 240° C. and about 250° C., which is equivalent to a focus ring temperature between about 90° C. and about 110° C., the etch rate for silicon oxide is substantially not affected at the edges of the wafer at five different source voltage levels, and at five different bias voltage levels, respectively. The effectiveness of the present invention focus ring assembly 50 is shown in the figures.

The present invention further discloses a method for operating a plasma chamber that is equipped with a temperature-controlled focus ring. It should be noted that the focus ring assembly 50 can be either cooled or heated. For instance, when the etch rate at the edge portion of the wafer decreases, the focus ring 52 should be chilled by a cooling system (shown in FIG. 3) in order to decrease the temperature of the focus ring 52 and thus, decreasing the adsorption of fluorine ions on the focus ring surface.

To the contrary, when the etch rate along the wafer edge is too high, the temperature of the silicon focus ring 50 may be increased in order to draw more fluorine ions onto the silicon focus ring and thus, decreasing the plasma density along the edges of the wafer, resulting in a decrease in the etch rate along the wafer edge. It has been shown that for silicon focus rings operating in a plasma etch chamber utilizing fluorine chemistry, a suitable temperature of the focus ring is in the range of 100° C.±30° C.

The present invention method may be carried out by first providing a plasma chamber that is equipped with a chamber enclosure, a plasma generating means, a wafer pedestal, a focus ring and a heat transfer means in intimate contact with the focus ring; then mounting a wafer to be processed on top of the wafer pedestal; then controlling a temperature of the focus ring by the heat transfer means to a predetermined temperature; and igniting a plasma in the cavity and substantially confining the plasma to a top surface of the wafer by the temperature-controlled focus ring.

The present invention novel focus ring assembly, the plasma chamber equipped with a temperature-controlled focus ring assembly and a method for operating the plasma chamber have therefore been amply described in the above description and in the appended drawings of FIGS. 3, 3A, 5A and 5B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A focus ring assembly for use in a plasma chamber comprising:
   a focus ring surrounding a wafer pedestal for confining plasma ions to a top surface of a wafer positioned on said wafer pedestal;
   a heat transfer means in intimate contact with said focus ring for decreasing or increasing a temperature of the focus ring; and
   a controller for controlling the temperature of the focus ring to a preset value.

2. A focus ring assembly for use in a plasma chamber according to claim 1, wherein said focus ring is fabricated of a material that adsorbs plasma ions on a top surface of the focus ring.

3. A focus ring assembly for use in a plasma chamber according to claim 1, wherein said focus ring is fabricated of silicon and said process chamber generates fluorine-containing plasma.

4. A focus ring assembly for use in a plasma chamber according to claim 1, wherein said heat transfer means is in intimate contact with a bottom surface of said focus ring.

5. A focus ring assembly for use in a plasma chamber according to claim 1, wherein said heat transfer means being a cooling means.

6. A focus ring assembly for use in a plasma chamber according to claim 1, wherein said heat transfer means being a heating means.

7. A focus ring assembly for use in a plasma chamber according to claim 1, wherein said heat transfer means being formed in a ring shape having a planar top surface area substantially the same as a bottom planar surface area of said focus ring.

8. A focus ring assembly for use in a plasma chamber according to claim 1, wherein said focus ring surrounds an electrostatic wafer chucking device.

9. A focus ring assembly for use in a plasma chamber according to claim 1, wherein said focus ring is fabricated of silicon and is sufficiently cooled such that substantially no fluorine ions or radicals are adsorbed on a top surface of said focus ring.

10. A focus ring assembly for use in a plasma chamber according to claim 1, wherein said focus ring is controlled to a temperature within a range of $100° C.\pm30° C$.

11. A plasma chamber equipped with a temperature-controlled focus ring comprising:
    a chamber enclosure defining a cavity therein capable of maintaining a pressure not higher than 1 Torr;
    a plasma generating means for producing a plasma in said cavity;
    a wafer pedestal for holding a wafer thereon;
    a focus ring surrounding said wafer pedestal for confining plasma ions to a top surface of said wafer held on said wafer pedestal; and
    a heat transfer means in intimate contact with said focus ring for controlling a temperature of said focus ring.

12. A plasma chamber equipped with a temperature-controlled focus ring according to claim 11, wherein said wafer pedestal is an electro-static wafer chucking device.

13. A plasma chamber equipped with a temperature-controlled focus ring according to claim 11 further comprising a controller for controlling a temperature of said focus ring to a predetermined value.

14. A plasma chamber equipped with a temperature-controlled focus ring according to claim 11, wherein said plasma produced in said chamber cavity is a fluorine-containing plasma for etching oxide layers on a wafer.

15. A plasma chamber equipped with a temperature-controlled focus ring according to claim 11, wherein said focus ring is fabricated of a material that adsorbs plasma ions or radicals on a top surface of the focus ring.

16. A plasma chamber equipped with a temperature-controlled focus ring according to claim 11, wherein said focus ring is fabricated of silicon.

17. A plasma chamber equipped with a temperature-controlled focus ring according to claim 11, wherein said heat transfer means controls a temperature of said focus ring within a range of $100° C.\pm30° C$.

* * * * *